TUNER HAVING WAFER SWITCH DISCS SHIELDED
FROM TURRET SWITCH DISCS BY CHASSIS

Filed Sept. 11, 1957 4 Sheets-Sheet 1

INVENTOR.
Reuben C. Carlson
BY Donald W. Phillion
ATTORNEY

Aug. 4, 1959 R. C. CARLSON 2,898,465

TUNER HAVING WAFER SWITCH DISCS SHIELDED FROM TURRET SWITCH DISCS BY CHASSIS

Filed Sept. 11, 1957 4 Sheets-Sheet 2

INVENTOR.
Reuben C. Carlson
BY Donald W. Phillips
ATTORNEY

Aug. 4, 1959 R. C. CARLSON 2,898,465

TUNER HAVING WAFER SWITCH DISCS SHIELDED FROM TURRET SWITCH DISCS BY CHASSIS

Filed Sept. 11, 1957 4 Sheets-Sheet 3

INVENTOR.
Reuben C. Carlson
BY Donald V. Phillips
ATTORNEY

INVENTOR.
Reuben C. Carlson
BY Donald W. Phillion
ATTORNEY

United States Patent Office 2,898,465

Patented Aug. 4, 1959

2,898,465

TUNER HAVING WAFER SWITCH DISCS SHIELDED FROM TURRET SWITCH DISCS BY CHASSIS

Reuben C. Carlson, River Grove, Ill.

Application September 11, 1957, Serial No. 683,388

1 Claim. (Cl. 250—40)

This invention relates, generally, to tuner structures for television receivers, and more specifically to a simplified tuner structure of the type in which the various tuning inductors are mounted upon rotatable discs.

There are, in the prior art, many disc-type tuner structures, some of which have enjoyed considerable commercial success. The more advanced type of disc tuner comprises two discs; one of which is employed to support the inductors used in the radio frequency amplifying stage, and the other of which is employed to support the inductors employed in the local oscillator and the mixer stages.

A primary purpose in the development of tuners is, of course, to improve their performance, but at the same time to simplify them and to make them less bulky. In the prior art tuner employing two discs, the discs are usually constructed of ceramic material upon which are mounted the various inductors. The remaining circuitry, including resistors, capacitors, and other inductors associated with the radio frequency amplifying stage, the local oscillator, and the mixer stage, is usually mounted upon the tuner chassis between the two discs. For electrical shielding reasons, and also because of mechanical advantages gained thereby, such as, for example, to provide a supporting structure for the shaft upon which the two discs are mounted, metallic barriers are employed to provide separate compartments in the tuner chassis for the two discs, and also to provide separate compartments for the circuitry associated with the radio frequency amplifier and the circuitry associated with the local oscillator and mixer stages.

An object of the present invention is to provide a television receiver disc-type tuner having a minimum amount of shielding baffles.

A further object of the invention is to simplify the construction of that portion of a disc-type tuner employed to insert various tuning inductors into the radio frequency amplifying circuit.

Other objects of the invention are to reduce the size and the cost of disc-type tuners and to improve such tuners, generally.

In accordance with the invention, there is provided a tuner chassis including a metallic plate formed to have a recessed channel therein extending across said plate. A rotatable shaft extends perpendicularly through said plate. On a first side of said plate is mounted the radio frequency circuitry, and on the other side of said plate is mounted the circuitry associated with the local oscillator and the mixer stages. Also, positioned on the first side of the plate are a plurality of first tuning inductors and a wafer-type switch constructed to respond to the rotation of said shaft to selectively insert individual ones of said tuning inductors into said radio frequency circuit. Positioned on said other side of said plate and mounted on said shaft is a disc of insulative material and a plurality of second tuning inductors. Contacts located on said disc function to connect selectable ones of said second tuning inductors into said local oscillator and mixer circuits.

In accordance with a feature of the invention, only a single baffle is employed in separating the radio frequency circuitry, the associated tuning inductors, and switching means therefor from the local oscillator and mixer circuitry, the associated tuning inductors, and switching means therefor.

In accordance with a specific form of the invention, a cascode-type radio frequency amplifier is employed in the tuner. Under these conditions, it has been found expedient to mount only the input stage of the cascode-type amplifier on the said first side of said plate, and to mount the output stage of the cascode-type amplifier on the said other side of said plate. An additional metallic shield is provided to separate the local oscillator and the mixer circuitry from the said output stage of the cascode amplifier.

In accordance with another feature of the invention, the switching means located on said first side of said plate comprises a wafer-type switch which can be constructed to fit within the recessed channel of said plate, thus further decreasing the expense and size of the tuner.

The above-mentioned and other objects and features of the invention will be more fully understood from the following detailed description thereof, when read in conjunction with the drawings, in which.

In the various figures, corresponding elements will be identified by the same reference characters, although primed in varying degrees in different figures.

Figure 1:
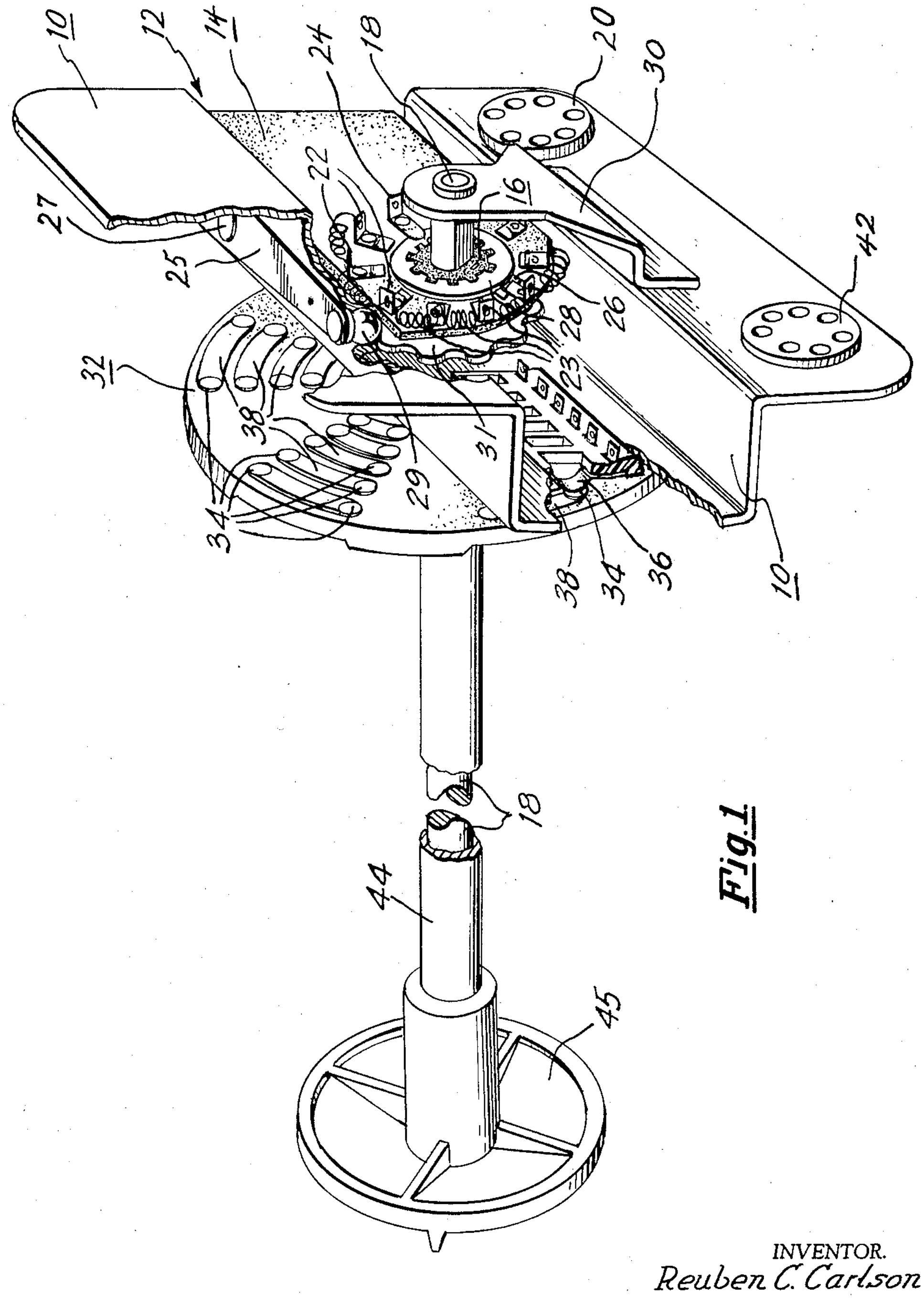
Fig. 1 is a perspective view of the invention, with portions broken away.

Referring now to Fig. 1, there is shown a plate 10 having a recessed groove 12 therein which extends across the length of the plate. Securely mounted upon plate 10 is a board 14 of insulative material, which board performs a double function. These two functions are, firstly, to provide a place for mounting some of the radio frequency circuit components and, secondly, to provide the stator for the aforementioned wafer switch. Other components of the radio frequency circuitry, including the antenna input circuit and the input stage of the cascode amplifier circuitry, are mounted at other convenient locations within the channel 12. The radio frequency amplifier tube mounts in the socket 20.

Connected between the contacts on the stator 14, such as contacts 22, are the tuning inductors, such as tuning inductors 23, which are inserted individually into the radio frequency amplifier in accordance with the angular position of the rotor 16. More specifically, the operation is as follows: Stator contact 24 makes continuous contact with the metal ring 28 of the rotor 16, thus providing a constant reference potential, such as ground potential, to said ring 28. The slider contact 26, which can be an integral part of the ring 28, makes contact with consecutive ones of the contacts 22, as the rotor 16 is rotated. As can be seen from the structure of Fig. 1, the individual tuning inductors connected between the contacts 22 form a continuous inductor with the contacts 22 acting as tap-in points so that as the rotor is rotated in a clockwise direction, or in a counter-clockwise direction, the amount of inductance inserted into the radio frequency amplifier will be increased or decreased in the proper amount to tune the radio frequency amplifier to the various television channels. The bracket 30 is rigidly secured to the plate 10 and functions to provide a support for the shaft 18.

On the other side of the plate 10 is located a disc 32 of insulative material which is supported upon the shaft 18 so as to rotate with said shaft. Mounted upon the disc 32 are a plurality of inductors and a plurality of contacts, such as contacts 34. It will be observed that the contacts are arranged in circular rows, the adjacent contacts in any given circular row being spaced apart equal angular distances. It is further noted that the contacts of the circular rows of contacts form groups of contacts lying along radially disposed lines, so that as the disc 32 is rotated each group of radially disposed contacts simultaneously will sweep across the group of stationary contacts, such as contacts 36 (shown more clearly in the structure of Fig. 2). The tuning inductances mounted on the disc 32 are inserted into the local oscillator and the mixer circuit by means of the groups of contacts 34 and 36.

Figure 2:
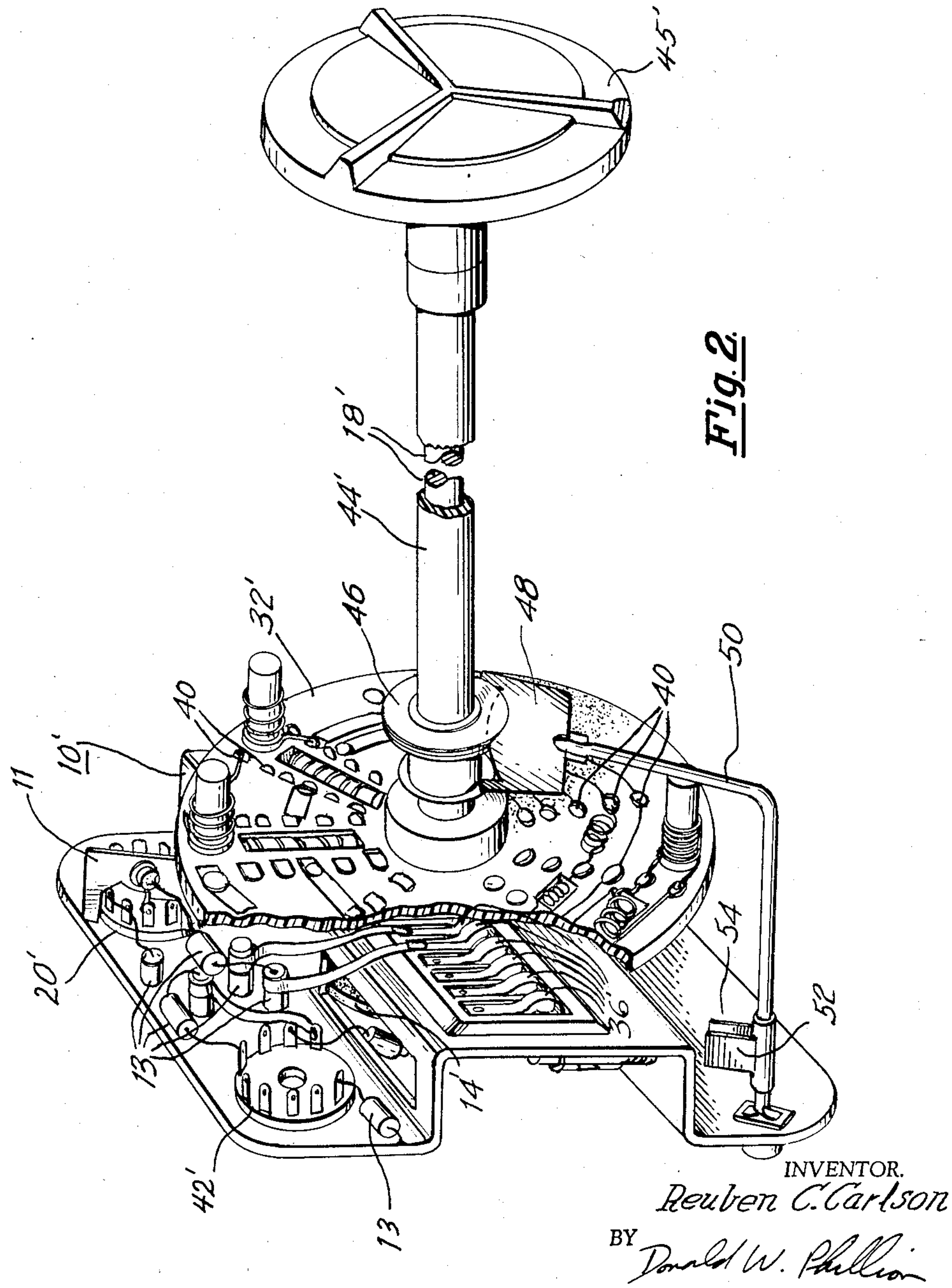
Fig. 2 is another perspective sketch of the invention, viewed from another position and with portions broken away.

Referring now more specifically to the nature and arrangement of the inductors mounted on the disc 32, it is to be noted that such inductors are mounted on both sides of the disc 32. On the side of the disc 32 exposed to the viewer in the structure of Fig. 1, the inductors consist of strips of conductive material, such as strips 38, for example. The contacts 34 may be formed by stamping raised portions into the ends of the metal strips 38. On the other side of the disc 32, as shown in the structure of Fig. 2, are shown coil wound inductors and also metal strip inductors. It is to be noted that the aforementioned coil wound inductors and metal strip inductors are shown only to indicate their general nature and position, and are not depicted with exactness. As the shaft 18′ is rotated to each of its thirteen discrete angular positions (corresponding to the current thirteen channels in use in commercial television) different combinations of these various tuning inductors are inserted into the local oscillator circuit and the mixer circuit to tune said local oscillator and said mixer circuits to the proper frequencies. The many terminals of Fig. 2, such as terminals 40, are formed by inserting through apertures provided therefor in the disc 32′ the ends of the metal strip conductors which are mounted on the hidden side of said disc in the structure shown in Fig. 2. For a more detailed description of the disc 32, reference is hereby made to co-pending application serial No. 528,262, filed August 15, 1955 by Reuben C. Carlson, and entitled "Tuner," now Patent No. 2,868,985, granted January 13, 1959. Such co-pending application is hereby incorporated as a part of this specification.

The circuitry associated with the local oscillator and the mixer circuit is positioned on the same side of said plate 10′ as is the disc 32′ and, more specifically, can be mounted conveniently in the vicinity of the tube socket 42′. A vacuum tube such as a 6CG8, which comprises a triode and a heptode within one envelope, is mounted in the tube socket 42′ and functions to provide a vacuum tube for both the local oscillator and the mixer circuit.

The fine tuning structure, shown in Fig. 2, will now be discussed. Rotatably mounted on the shaft 18′ is a cylinder 44′ of insulative material. Mounted rigidly upon this cylinder 44′ is a pulley-like structure 46, having a grooved edge, into which fits the arcuate edge of the member 48. As the cylinder 44′ is rotated, the pulley-like element 46 will also rotate to move the element 48, which in turn will rotate the shaft 50 upon which is mounted the capacitor plate 52. It can be seen from Fig. 2 that rotating the shaft 50 will vary the distance between the capacitor plate 52 and the stationary capacitor plate 54, which effects the desired fine tuning.

Element 45′ represents the control knobs for independently controlling the shaft 18′ and the tube 44′.

Figure 3:
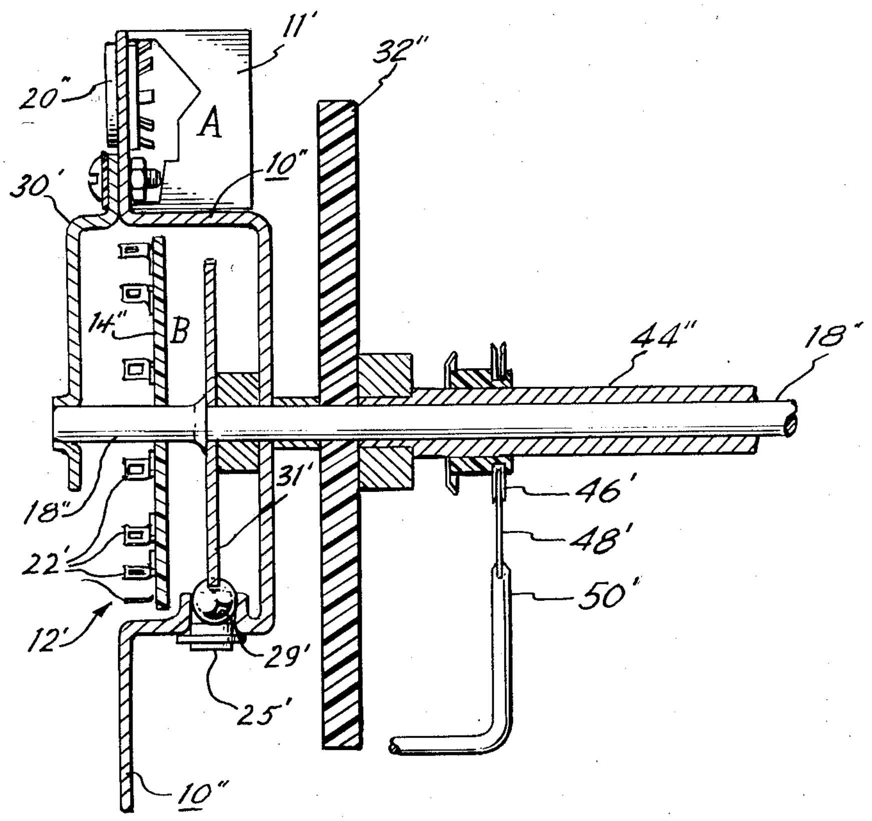
Fig. 3 is a plan view of the invention taken along the axis of the rotatable shaft.

Referring now to Fig. 3, there is shown a plan view of the invention which illustrates clearly the arrangement of the various elements along the shaft 18″. None of the components are shown in this view. In Fig. 3 it can be clearly seen how efficiently the plate 10″ with the channel 12′ formed therein functions to electrically separate the area A, where the local oscillator and the mixer circuitry is located, from the area B, where most of the radio frequency circuitry is located, while at the same time providing for a compact spatial arrangement of the board 14″ (including the wafer switch) and the ratchet wheel 31′ which will be described in detail later herein.

Figure 4:
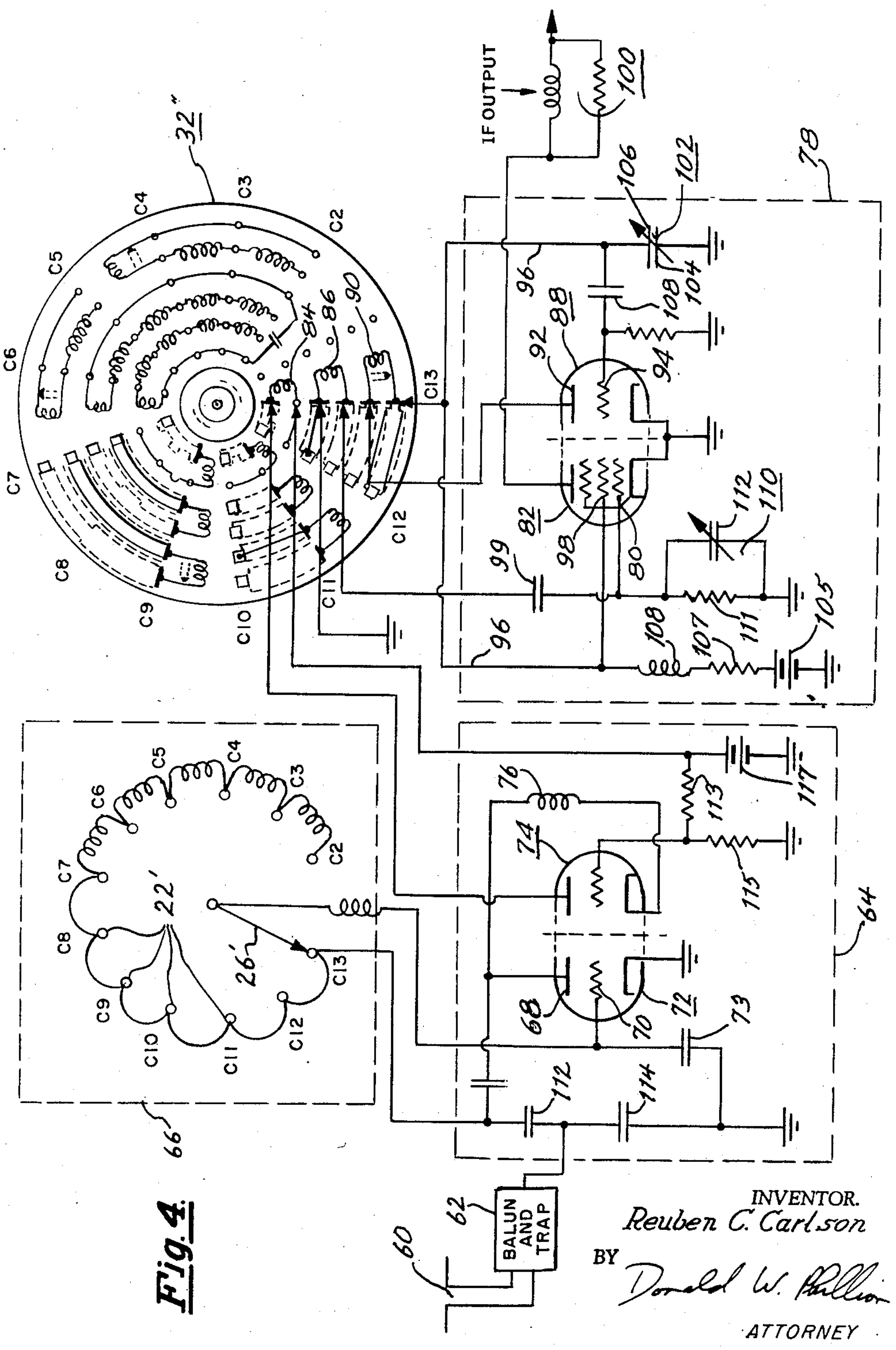
Fig. 4 is a schematic sketch of the circuitry of the invention.

Referring now to Fig. 4, there is shown the circuit which is mounted upon the tuner chassis. In the following descriptive material it will be shown where the various portions of the circuit of Fig. 4 are mounted upon the tuner chassis, i.e., upon which side of the plate 10 (Fig. 1) the various portions of said circuit are mounted. First, however, a brief description of the circuit will be given. The antenna 60 intercepts the transmitted signal and supplies said signal to an antenna input circuit (a balun) and thence to a trap circuit, both of which are included in the block 62. From the block 62 the signal is supplied to a cascode-type radio frequency broadband amplifier circuit 64 through a tuned input circuit comprising coupling capacitor 112, an inductor contained within the dotted block 66, and capacitor 73. It will be noted that the magnitude of the inductor inserted into the input circuit can be varied by moving the arm 26′ to any of the contacts 22′ to tune said input circuit to the nominal carrier frequency of the television channel desired. The channels corresponding to each of the contacts 22′ are indicated by the reference characters $C_2$ through $C_{13}$, which represent channels 2 through 13, respectively, as do the same reference characters employed in connection with the disc 32″, also shown in Fig. 4. The inductors represented schematically in the dotted block 66 of Fig. 4 are the same inductors mounted on the wafer switch discussed in connection with the structure of Fig. 1. It will be noted that the inductors between adjacent contacts 22 corresponding to higher frequency channels 7 through 13 consist only of a curved piece of wire.

The cascode amplifier 64 comprises of a vacuum tube having two triode sections. Triode section 72 functions to drive the triode section 74 through the inductor 76 which, together with the output stray capacitances of triode 72 and the input stray capacitances of the triode 74, forms a broad band impedance network. The plate voltage for tubes 72 and 74 is supplied from battery source 117, which also supplies bias for grid 109 by means of the voltage divider comprised of resistors 113 and 115.

The output signal of the cascode amplifier 64 is supplied to the control grid 80 of the mixer tube 82 (located within dotted rectangle 78) by means of the inductive coupling between the tuning coil 84 and the tuning coil 86, which are supported upon the disc 32″, and through the coupling capacitor 99. Also located within the dotted rectangle 78 is the local oscillator circuit including the triode 88. Tuning of the local oscillator circuit is accomplished by means of insertion therein of an inductor supported upon the disc 32″. In the particular example shown in the structure of Fig. 4, the inductance inserted in the local oscillator is inductor 90 which, in cooperation with capacitor 108 and variable capacitor 102, forms a resonant circuit which tunes said local oscillator to the frequency necessary for the reception of the channel 13 signal. A portion of the signal developed in this resonant circuit is supplied to the screen grid 98 of tube 82 of the mixer circuit via conductor 96.

Fine tuning of the local oscillator is accomplished by the variable capacitor 102, the plate 104 of which corresponds to the movable plate 52 shown in Fig. 2, and the plate 106 of which corresponds to the plate 54 shown in Fig. 2. Coil 108 performs a peaking function for the signals of higher frequency channels supplied to the mixer circuit. Resistor 107 connects the voltage supply 105 to the circuit. Network 110 includes a trimming capacitor 112 for adjusting the resonant frequency of the input circuit of the mixer tube 82 and a grid leak resistor 111. Filter circuit 100 functions to pass only the desired freqency bandwidth to the intermediate frequency stage (not shown).

The physical location, with respect to the metallic plate of the various portions of the circuitry shown in Fig. 4, will now be discussed. The balun and the trap represented by the block 62 can be mounted on the insulative board 14 (see Fig. 1). The input section of the cascode amplifier may be mounted on the far side of the insulative barrier 11 (in Fig. 2), whereat are located also the tube socket terminals (of tube socket 20′) leading to the driver stage of the cascode amplifier. On the near side of the barrier 11 (in Fig. 2) is mounted the circuitry (excluding the tubes 82 and 88) contained within the block 78 of Fig. 4. As discussed before, this circuitry is associated with the local oscillator and the mixer circuit, which use tubes contained in the same envelope which fits into the tube socket 42′. Also mounted on the near side of the barrier 11 are the tube socket terminals (of tube socket 20′) leading to the output stage of the cascode amplifier. It will be evident at this point that the metallic barrier 11 functions to shield the input stage of the radio frequency cascode amplifier from the output stage of the cascode amplifier and the local oscillator and mixer circuits. Typical examples of how some of the components in the last-mentioned circuitry can be mounted are shown in Fig. 2 and are represented, generally, by the reference character 13. The specific group of components shown are not intended to include all the components of the actual circuitry. The filter circuit 100 can be positioned within the recessed channel of the plate 10′ at the opposite end of the channel 12 (Fig. 1) from the balun circuit and the trap circuit.

Referring again to the structure of Fig. 1, the detent mechanism will be described. A flat spring element 25 is fastened securely at one end 27 to the plate 10. The other end of the spring 25 presses a steel ball bearing 29 against the corrugated edge of the ratchet wheel 31 through an aperture in the plate 10. As can be seen from Fig. 1, the number of discrete angular positions of the shaft 18, upon which the ratchet wheel 31 is mounted, will be determined by the number of depressions in the perimeter of the ratchet wheel 31.

It is to be noted that the form of the invention shown and described herein is but a preferred embodiment of the same and that various changes may be made in the physical configuration and the positioning of the circuit elements without departing from the spirit or scope of the invention.

I claim:

A television tuner including a chassis for supporting a plurality of tuning devices, said chassis formed with a recess having a U-shaped cross section and terminating in outwardly extending flanges, said flanges forming with the sides of said recess a pair of compartments, a shaft rotatably supported on said chassis substantially intermediate the sides of said recess and having an axis perpendicular to the base of said recess, a first plurality of tuning inductors fixedly mounted within said recess, a rotatable contact means mounted on said shaft within said recess for selecting some of said first plurality of tuning inductors, a second plurality of tuning inductors mounted on said shaft on the opposite side of the base of said recess, stationary contact means on the opposite side of the base of said recess for selecting some of said second plurality of tuning inductors, said compartments having mounted therein circuitry and components associated with said second plurality of inductors and said stationary contact means, whereby said recess and said compartments provide electrical isolation and shielding between the input and output stages of the tuner.

References Cited in the file of this patent

UNITED STATES PATENTS

| | | |
|---|---|---|
| 2,046,927 | Riley | July 7, 1936 |
| 2,584,120 | Fyler | Feb. 5, 1952 |
| 2,646,500 | Romero | July 21, 1953 |
| 2,771,548 | Deutsch | Nov. 20, 1956 |
| 2,810,827 | Nordby | Oct. 22, 1957 |
| 2,842,660 | Brown | July 8, 1958 |